(12) United States Patent
Le Pennec et al.

(10) Patent No.: US 7,664,881 B2
(45) Date of Patent: Feb. 16, 2010

(54) PACKET HEADER COMPRESSION SYSTEM AND METHOD BASED UPON A DYNAMIC TEMPLATE CREATION

(75) Inventors: Jean-François Le Pennec, Nice (FR); Claude Galand, La Colle sur Loup (FR)

(73) Assignee: AT&T Corp., New York, NY (US)

( * ) Notice: Subject to any disclaimer, the term of this patent is extended or adjusted under 35 U.S.C. 154(b) by 1344 days.

(21) Appl. No.: 10/886,956

(22) Filed: Jul. 8, 2004

(65) Prior Publication Data

US 2005/0041660 A1    Feb. 24, 2005

(30) Foreign Application Priority Data

Jul. 8, 2003    (FR) .................................. 03 08318

(51) Int. Cl.
*G06F 15/16* (2006.01)
(52) U.S. Cl. ...................... 709/247; 709/227; 709/228; 709/246
(58) Field of Classification Search ......... 709/246–247, 709/223–226, 227–229
See application file for complete search history.

(56) References Cited

U.S. PATENT DOCUMENTS 5,467,087 A * 11/1995 Chu ............................ 341/51
5,850,526 A * 12/1998 Chou ......................... 709/247
6,032,197 A *  2/2000 Birdwell et al. ............. 709/247

(Continued)

FOREIGN PATENT DOCUMENTS

GB    2386805 A  *  9/2003

(Continued)

OTHER PUBLICATIONS

Jon B. Postel, ed., "RFC-793: Transmission control protocol." Request For Comments, Sep. 1981.*

(Continued)

*Primary Examiner*—Joseph Thomas
*Assistant Examiner*—Brendan Higa

(57) ABSTRACT

Header compression system for compressing the header of the data packets of a flow transmitted from an ingress node to an egress node through a data transmission network comprising template creating means, in both ingress node and egress node, adapted for creating the same compression template from a predetermined number of uncompressed data packets at the beginning of the flow respectively transmitted by the ingress node and received by the egress node, and header compression means, in the ingress node, adapted for compressing the header of each packet following the predetermined number of uncompressed data packets before transmitting it through the data transmission network, the compression being achieved by using the compression template.

34 Claims, 6 Drawing Sheets

U.S. PATENT DOCUMENTS

| | | | | |
|---|---|---|---|---|
| 6,041,054 | A | * | 3/2000 | Westberg .................... 370/389 |
| 6,680,955 | B1 | * | 1/2004 | Le ............................. 370/477 |
| 6,711,164 | B1 | * | 3/2004 | Le et al. .................... 370/392 |
| 6,751,209 | B1 | * | 6/2004 | Hamiti et al. ............... 370/349 |
| 6,967,964 | B1 | * | 11/2005 | Svanbro et al. ............ 370/437 |
| 6,976,081 | B2 | * | 12/2005 | Worger et al. ............... 709/230 |
| 7,010,727 | B1 | * | 3/2006 | Stucker ...................... 709/247 |
| 7,065,087 | B2 | * | 6/2006 | Koren et al. ................ 370/394 |
| 7,154,416 | B1 | * | 12/2006 | Savage ....................... 341/51 |
| 7,158,491 | B1 | * | 1/2007 | Le ............................. 370/328 |
| 7,317,724 | B2 | * | 1/2008 | Koren et al. ................ 370/394 |
| 7,359,974 | B1 | * | 4/2008 | Quinn et al. ................ 709/228 |
| 7,420,992 | B1 | * | 9/2008 | Fang et al. .................. 370/477 |
| 2002/0071432 | A1 | * | 6/2002 | Soderberg et al. .......... 370/389 |
| 2006/0075134 | A1 | * | 4/2006 | Aalto et al. ................. 709/238 |

FOREIGN PATENT DOCUMENTS

WO     WO 02/26860     *    4/2002

OTHER PUBLICATIONS

V. Jacobson, "Compressing TCP/IP headers for low-speed serial links", RFC 1144, Network Infommfion Center, SRI International, Menlo Park, CA, Feb. 1990.*
Bormann, et al., RObust Header Compression (ROHC), Network Working Group, Internet Draft, dated Nov. 24, 2000, p. 1-156.
Jacobson, V., Compressing TCP/IP Headers for Low-Speed Serial Links:, RFC 1144, Feb. 1990, p. 1-43.
Search Report dated May 26, 2004 for corresponding French Application, FR 0308318.

* cited by examiner

PACKET HEADER COMPRESSION SYSTEM AND METHOD BASED UPON A DYNAMIC TEMPLATE CREATION

CROSS-REFERENCE TO RELATED APPLICATIONS

This application claims benefit of French patent application serial number 0308318, filed Jul. 8, 2003, which is herein incorporated by reference.

BACKGROUND OF THE INVENTION

Field of the Invention

The present invention relates generally to the compression of the headers of the data packets transmitted within a data transmission network and in particular relates to a packet header compression system and method based upon a dynamic template creation.

The use of header compression for data packets transmitted through a data transmission network using the IP protocol, or other protocols, relies on the fact that many fields of the header are constant or change rarely in consecutive data packets belonging to the same flow. The common rule used in the compression technique is based on the fact that header fields that do not change between packets need not be transmitted. The fields that change with predictable values (e.g. TCP sequence numbers) can be encoded incrementally so that the number of bits needed for these fields decrease significantly. Only fields that change often or randomly, e.g. checksums or authentication data need to be transmitted in every header.

Most of compression techniques are based on templates which define which bits of the header need to be transmitted. Standard mechanisms use fixed templates for each type of protocol. But, in complex IP environment (VoIP, IPv4, IPv6, tunneling), not all of the IP stack combinations have predefined templates being available. Furthermore, the coexistence of several different mechanisms is difficult or even impossible. So, nowadays, the header compression is not very often used or limited to few protocols.

The IETF (Internet Engineering Task Force) has documented several header compression mechanisms that are based on the above rules. The original header compression scheme, CTCP, compresses the 40 octets IP+TCP header to 4 octets. The CTCP compressor detects transport-level retransmissions and sends a header that updates the context completely when they occur. This repair mechanism does not require any explicit signaling between compressor and decompressor.

Another mechanism, CRTP, is a header compression scheme that compresses 40 octets of IPv4/UDP/RTP headers into a minimum of 2 octets when the UDP Checksum is not enabled. If the UDP Checksum is enabled, the minimum CRTP header is 4 octets. CRTP cannot use the same repair mechanism as CTCP since UDP/RTP does not retransmit. Instead, CRTP uses explicit signaling messages from decompressor to compressor, called CONTEXT_STATE messages, to indicate that the context is out of sync. The link round-trip time will thus limit the speed of this context repair mechanism. On high loss links with long round-trip times, such as most cellular links, CRTP does not perform well. Each lost packet over the link causes several subsequent packets to be lost since the context is out of sync during at least one link round-trip time.

Most of the above RFCs and documents related to header compression are based on static templates defined for one or a set of protocols. A specific template is therefore built for each kind of protocol header wherein only variable fields to be transmitted are included. Both peer devices that use this compression mechanism are configured to use it either statically in the configuration or dynamically with a protocol to define which method to use. Then, when a flow of data from a source node to a destination node is initiated, the first frame is transmitted with a full packet and for the subsequent frames, only compressed headers are transmitted according to the predefined or agreed upon template.

With static templates, several problems are raised. Thus, all necessary templates have to be predefined, and it is necessary to maintain the right template for a flow. Another problem is to have a single processing that does not kill the engine and memory and that can be applied to different flows independently. Another issue is the efficiency of the compression as some flows cannot be compressed correctly without having corresponding templates predefined which is quite impossible with the number of different protocols to support. At last, there is also the problem of negotiation and possible associated overhead.

Until now, most of the efforts have been done to reduce overhead due to header for low or medium speed links where processing impact for compressing header is not so important. The above mentioned compression methods are processing intensive as being bit oriented and based on specific templates having each different rules. Now, header compression should address high speed links as well and not only for compressing IP headers but a set of headers covering several Protocol layers as soon as some fields are unchanged between packets of a common flow.

Further to those header compression mechanisms used with IPv4, other mechanisms have been developed for IPv6. The implementation of these different mechanisms is complex insofar as the template based compression generally addresses only one of a predefined set of protocols and is not compatible and does not coexist with another mechanism. Thus, the CRTP mechanism is valid only for the VoIP headers and does not work with other types of flows.

SUMMARY OF THE INVENTION

Accordingly, the main object of the invention is to provide a system and to achieve a method wherein the template to be used for the header compression or decompression is dynamically generated for each flow identically in both ingress and egress nodes without requiring the transmission of the template between the nodes.

The invention therefore relates to a header compression system for compressing the header of the data packets of a flow transmitted from an ingress node to an egress node through a data transmission network comprising template creating means in both ingress node and egress node, adapted for creating the same compression template from a predetermined number of uncompressed data packets at the beginning of the flow respectively transmitted by the ingress node and received by the egress node, and header compression means, in the ingress node, adapted for compressing the header of each packet following the predetermined number of uncompressed data packets before transmitting it through the data transmission network, the compression being achieved by using the compression template.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
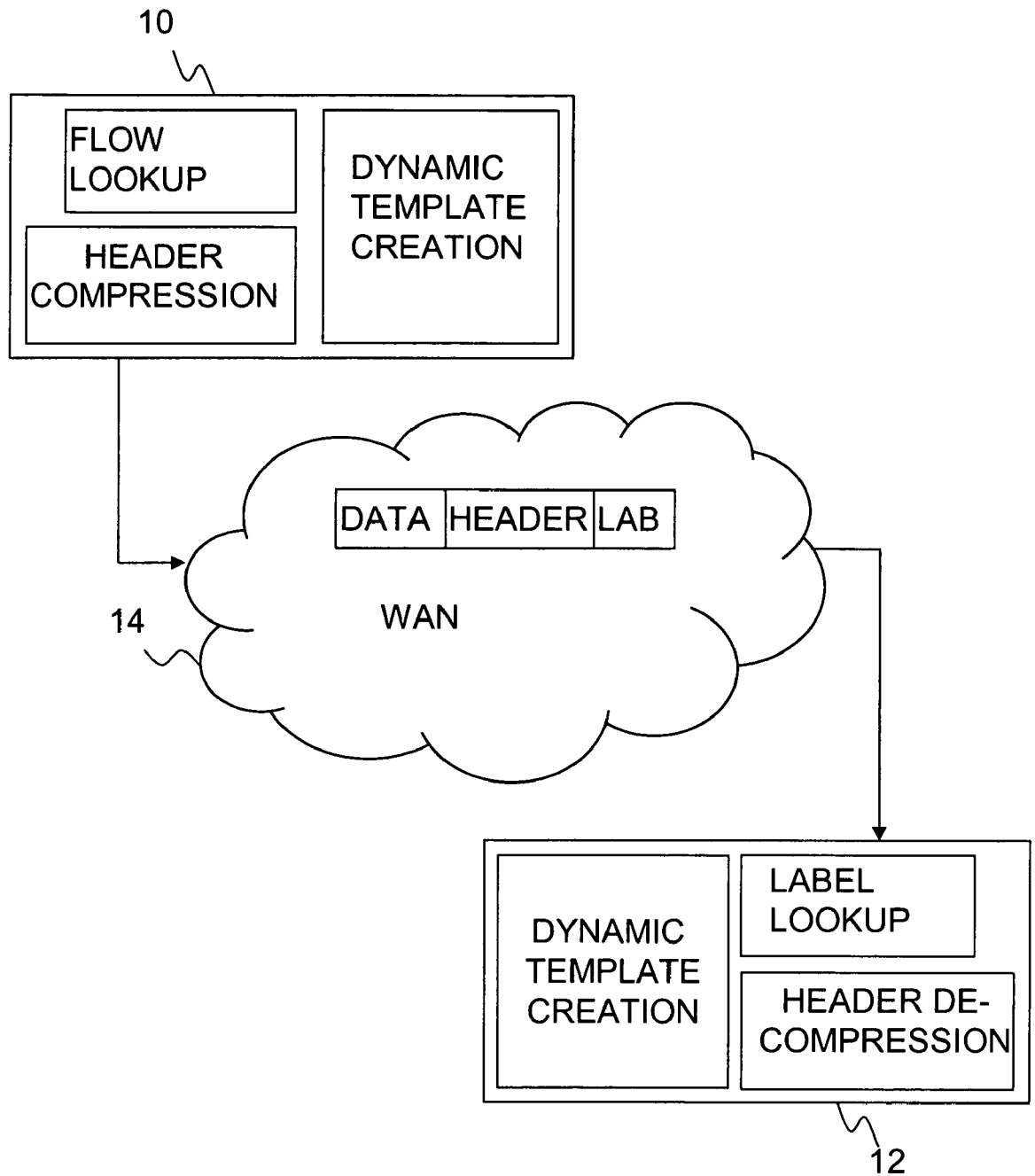
FIG. 1 is a block-diagram representing schematically a system implementing the invention wherein an ingress node transmits data flows to an egress node through a data transmission network.

In reference to FIG. 1, a system wherein the invention can be implemented includes essentially an ingress node 10 as a source which transmits data packets to an egress node 12 as a destination through a data transmission network 14. In the preferred embodiment, the network 14 is a label switched network but could be any kind of wide Area Network (WAN) wherein the data are transmitted by packet switching.

As explained hereafter, ingress node 10 is provided with a system wherein the header is compressed thanks to a compression template that is built dynamically for each flow.

Therefore, the ingress node contains three main functional building blocks which are a flow lookup block which determines if an existing template can be used or not for the incoming packet, a dynamic template creation block used to build a new template for a packet that cannot use existing templates and a header compression block which performs packet header compression when a template exists.

Similarly, egress node 12 is provided with a system wherein the header is decompressed thanks to a compression template that is built dynamically for each flow using the same process and algorithm of the ingress node. The egress node contains three main functional building blocks which are a label lookup block which determines if the incoming packet contains a compressed header or not, and in the former case to which template the incoming label is associated. In the latter case, a dynamic template creation block is used to build a new template. Finally, a header decompression block performs packet header decompression when a template exists, provided by the label lookup.

An essential feature is that a learning stage is used to build dynamic templates and, during this learning stage, packets of a flow are transmitted transparently which means without header compressed. In the preferred embodiment, a dedicated label called LABX is used for these uncompressed packets whereas a specific label LABC is associated to each template for transmitted packets having compressed headers related to the corresponding template.

The self-learning stage is done on normal IP packets that start a flow. A mask is built based on the analysis of several consecutive packets. For this, an exclusive OR (X-OR) is performed on all packets and becomes the base of the template (bit oriented) that needs just to be improved by identification of sequence number fields. This process will be described later with more details.

The process is the same on transmission and reception so that the template is not transmitted. Then, variable fields are identified and aggregated to build the compressed header. A mechanism will optimize the length of the template based on density ratio of compressible bits. To remove the risk of de-synchronization between the source and destination processes for template creation, the label used for transmitting clear (header not compressed) packets is followed by a sequence number field. In addition, packet integrity in insured by the IP packet checksum.

An example for template building is shown with few bytes (7) in binary notation and few packets: more packets, for example 8 packets, have to be used in order at least to identify sequence number fields:

| Packet 1: | 01011010 | 10010101 | 01100110 | 11010101 | 11011000 | 11100101 | 11010110 |
| Packet 2: | 01011110 | 10000101 | 11111111 | 11010101 | 11011001 | 11100101 | 11010110 |
| Packet 3: | 01011010 | 10011101 | 01100110 | 11010111 | 11011010 | 11111101 | 11010110 |

The template will be as follows:

| Mask:   | 00000100 | 00011000 | 10011001 | 00000010 | 00000011 | 00011000 | 00000000 |
| Master: | 01011X10 | 100XX101 | X11XX11X | 110101X1 | 110110YY | 111XX101 | 11010110 |

As shown above, the template includes the mask resulting from the X-OR of all packets and wherein the bits 0 correspond to the constant bits and the bits 1 correspond to changing bits, and the master wherein the bits 0 and 1 correspond to the real bits and the X correspond to the bits which have changed during the learning stage of packets.

It is assumed that, after the learning stage, the following packet N is received:

packet N:  01011010  10000101  01100110  11010111  11011011  11111101  11010110

Packet N being compliant with the master, the mask will apply: All the bits from N packet defined from the mask are aggregated for transmission: this corresponds to 000000011111.

If fact, in the example, two bits have been identified as YY because they look like an incremental field. In such case, the full byte at least (the predefined choice is generally one or two bytes) is set as not compressed so that a new template is created that is:

Template

| Mask: | 00000100 | 00011000 | 10011001 | 00000010 | 11111111 | 00011000 | 00000000 |
|---|---|---|---|---|---|---|---|
| Master: | 01011X10 | 100XX101 | X11XX11X | 110101X1 | YYYYYYYY | 111XX101 | 11010110 |

Resulting in Packet N compressed header being:

000000011101101111

Recovery, realignment, and template adjustment are done when errors occur by restarting the self-learning phase either from the beginning of the creation process or with the previous active template as starting point. In that case, a new label based on the LABC value is used to modify the corresponding template using new packets transmitted in clear with this label. For example, a flow will keep two labels having just one bit different for transporting either packets with compressed headers or clear packets for template update. As stated above, labels followed by clear packets are followed by sequence numbers. Therefore a register keeps the current sequence number for each LABX label in order to verify that no packet has been lost or found in error in the transmission. Another packet integrity improvement is to add a CRC (of the original header) for error transmission checking to identify need for activating recovery.

A template upgrade can also be done by transmitting one or more full packets when the incoming packet header to compress doesn't match the current header master (defined as being the set of unchanged bits of the template). It will activate a template modification process. The template will then converge to a stable set. The compression mechanism has to be cleared sometimes to become more optimized. This can be done by a threshold in the compression ratio, a number a packets transmitted or a timer.

The compressed header includes a field that indicates that it is a compressed header: this generally belongs to a lower layer (label, Vc, field in PPP) and has been already addressed in existing header compression mechanisms. In the preferred embodiment, a LABC value is used for a compressed header and a LABX value for an uncompressed header (clear) with a dedicated LABX value for flows based on the corresponding LABC value (one bit inverted) which improves the template upgrade process.

Figure 2:
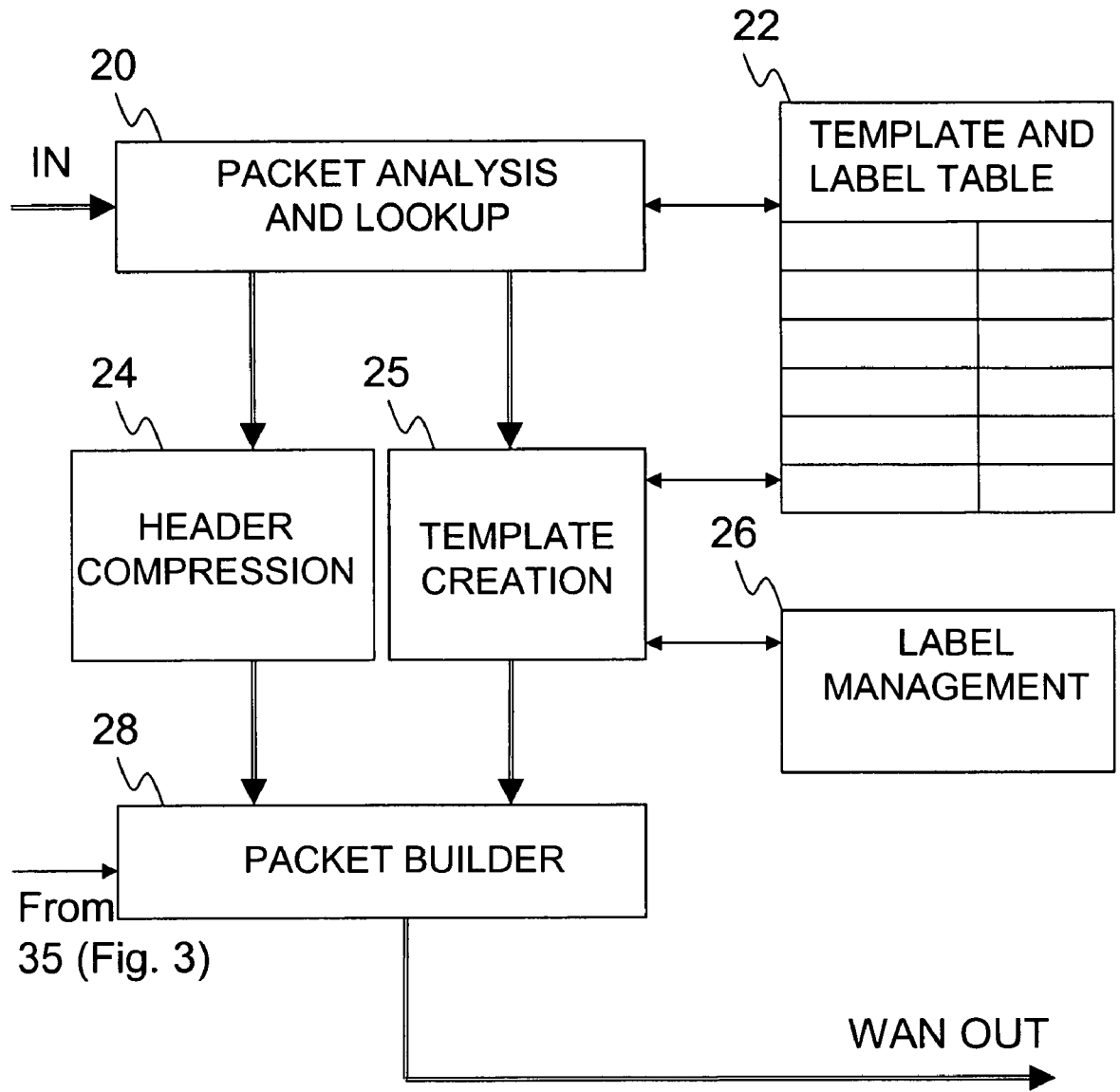
FIG. 2 represents a block-diagram of the mechanism within the ingress node used for generating the template and compressing the headers of the packets to be transmitted.

FIG. 2. describes the functional building blocks implemented in the ingress node. An original packet coming from input IN is analyzed in block 20 which performs a flow lookup. In IP, a flow is defined by packets having at least the same source address, the same destination address and generally using at least the same protocol. So, the lookup compares the packet header values with templates available in table 22. It should be noted that additional protocol analysis or actions are performed at this stage if not done earlier in the node input process. It includes routing, filtering if any and TTL decrementation. For example, the template table may contain routing statements associated to a flow or the routing lookup may be implemented separately to the header compression process. Such IP packet processing will not be detailed here as not being related to the invention. The selection of flows on which header compression is activated may also be done at this stage or earlier in the node processing as not all flows may need to have header compressed. One or Several labels may be reserved to transport packets that are not involved in the header compression mechanism. Such packets should not use the labels used for transporting uncompressed packets of flows for which compression is defined as they will impact the compression process. It may be also a way to solve computing performance limitation. When a defined processing level is reached, further incoming flows are not compressed to avoid processing overflow, the time to reach a more convenient level.

The template table 22, on which the lookup is performed, may contain either one or several flows matching the lookup or none. In the latter case the process of block 25 is activated in order to generate a new template for this flow. In the former case and if more than one template is available, a second step lookup will select the template that has the less undefined fields corresponding for example to the number of ones in the corresponding mask which is an easy calculation. Once the template to use is defined, the header compression process of block 24 is activated using the mechanism described in FIG. 1.

The new template creation process represented as block 25 may work either in new flow creation mode or flow upgrade mode. This mode is provided by the analysis made by the packet analysis and lookup block 20 which determines if the source address and/or the destination address of the flow are present in a template. If either the source address or the destination address is not defined in the template table for any flow, then a new flow template creation is needed. If source and destination address fields exist in a template stored in table 22, then an upgrade mode must be used. The main difference between both is that they use different labels for transmitting uncompressed packets that will help both sides to build the new template. As a reminder, a template is built in parallel in both ingress and egress node thanks to a set of uncompressed packets being sent prior to the compression. For that, a dedicated label whose value is derived from the label used for transmitting packets with compressed headers associated to the template of the flow is used. Labels for compressed headers are called LABC while labels for associated uncompressed headers are called LABX. They just differ as having one bit inverted so that there is an easy way to recognize one against the other.

A template is created using the method described in FIG. 1 thanks to several consecutive uncompressed packets. Once defined, a new template should be associated to a new label (one LABC and its corresponding LABX for further modifications). When the first packet is received to build the template, block 25 asks the label management block 26 to provide a new label for this template and stores it in table 22 as well in the defined row where the new template is added. When the process is completed, block 25 stores this new template in template table 22 with its associated label.

The label assignment and management method is not part of this invention as it may be implemented thanks to different methods. One method is the use of a label distribution protocol to assign a new label for both ingress and egress node for each new flow. Such label distribution protocol is generally dependent on the network infrastructure used such as MPLS. Another method is to assign LABC/LABX labels only on ingress node using a self assignment procedure, link dependent, and the other side (egress node) will understand for each new, not yet defined, LABX label that a new flow is being built and will update its database with corresponding LABC and LABX labels. In the latter implementation, only Labels for uncompressed flows referred as LABU should be predefined to avoid misunderstanding between ingress and egress labels assignments and use. An additional process is required to clear labels before reassigning them when no more free labels are available. The option control field of labels is used for such purpose on existing labels.

The new flow creation process forwards, until completion, each packet with uncompressed header and the associated LABX label to the packet builder 28 that, in such a case, will just forward the packet to the WAN OUT interface after adding a sequence number between the label and the packet. The sequence number is necessary to avoid building different templates on both sides if a packet is lost. If a packet is modified, the packet CRC should allow identifying the failure. In case of error, either a recovery mechanism is used to resend the missing packet or the template creation is reset for this flow. Reset is provided thanks to an option control field following the label that will be described with more details on FIG. 4.

As mentioned hereabove, when a template is found for an incoming packet, on block 20, the process continues on block 24. Block 20 provides block 24 with the packet itself or at least the part (number of bytes) that are included in the template, the template itself and the associated label (LABC) to use. The header compression mechanism is very simple as it just extracts the bits that are defined as changing from the packet header and aggregates them in the same order as they were in the original header. In other words, all constant bits in the header are removed and this builds the compressed header. As an option, a CRC of the original header is calculated.

The compressed header, the remaining data (directly from block 24 or from another intermediate storage depending on the hardware implementation), the LABC label and optionally the Header CRC are provided by block 24 to Packet builder block 28 that will append all these fields to build the compressed frame that is transmitted to WAN OUT interface. The packet builder may add if necessary the optional fields (CRC, length, control) for improved management of the compression mechanism between the label and the compressed header as defined in FIG. 4.

Figure 3:
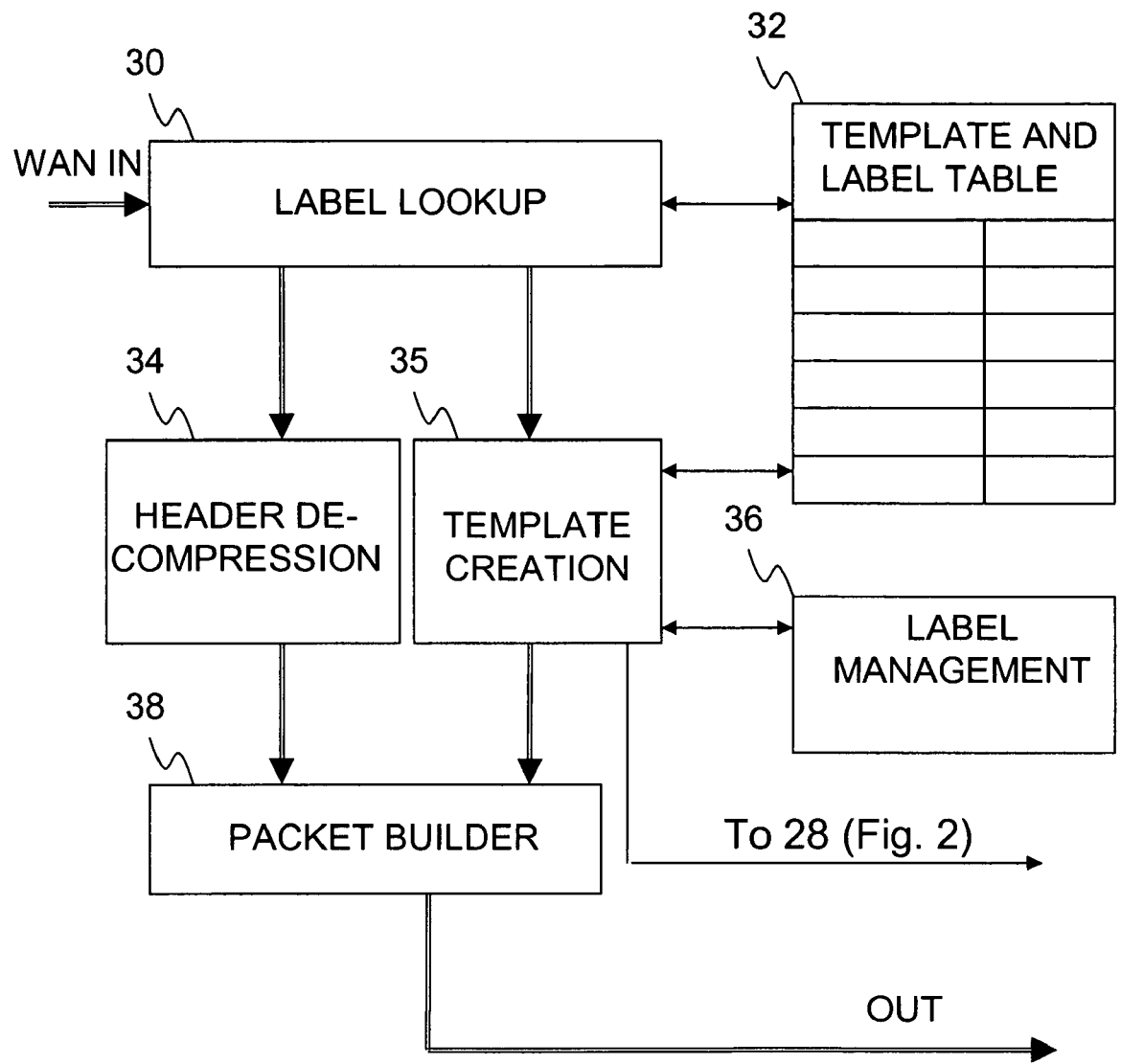
FIG. 3 represents a block-diagram of the mechanism within the egress node used for generating the template and decompressing the headers of the received packets.

FIG. 3. describes the functional building blocks implemented in the egress node. A packet coming from input WAN IN is analyzed in block 30 which performs a label lookup. So the lookup will first indicate whether the packet uses a compressed header or is a normal uncompressed packet. If the label is a LABC label, the packet is compressed and a template is associated. If the label is a LABX label, the packet is not compressed. In the later case, either the LABX label is a new LABX value so that a template creation process should begin, or the LABX is an existing label associated to a template (differing one bit from an existing LABC value) and a template modification (or label clear) starts. The label and template table 32, on which the lookup is performed, contains therefore one match or no match for the label.

If a LABC value is used, the packet (at least the fields up to and including the compressed header) are given to the header decompression block 34 that will rebuild the original header. If a LABX value is detected, the packet is forwarded to the template creation and update block 35 that will create a new template for the flow corresponding to the incoming packet. Block 35 validates the incoming sequence number to continue to create the template. In case of error, the process is stopped and an alert is provided to the transmit packet builder 28 of the same node in order to start recovery.

The new template creation process represented as block 35 is identical to the process of block 25 and results in the same template definition whether it works in new flow creation mode or flow upgrade mode. As mentioned in FIG. 2, the same dynamic template is built in parallel in both ingress and egress nodes thanks to a set of uncompressed packets being sent prior to the compression and processed respectively by blocks 25 and 35.

A template is therefore created in egress node using the method described in FIG. 1 thanks to several consecutive uncompressed packets. Once defined, a new template needs to be associated to a new label (one LABC and its corresponding LABX for further modifications). When the first packet is received to build the template, block 35 adds LABX and associated LABC row in table 32 which defines the fields where the new template for the corresponding flow is added. When the process is completed, block 35 stores this new template in template table 32 with its associated label.

The objective of label assignment is to finally assign the same label for the same template. The proposed automatic assignment on the ingress node with recognition on the egress node fits such requirement.

The new flow creation process forwards, until completion, each packet with uncompressed header and the associated LABX label to the packet builder 38 that, in such a case, will just forward the packet to the OUT interface after removing the label and optional fields to just keep the original packet received on input IN of FIG. 2.

As mentioned hereabove, when a LABC type of packet is received and a template is found for the incoming packet, on block 30, the process continues on block 34. Block 30 provides block 34 with the packet itself or at least the fields up to and including the compressed header and the template itself in order to rebuild the original header and possibly check it if a CRC is added. The header decompression mechanism is very simple as it just replaces the missing bits that are defined as changing in the template by the received bits of the compressed header that restore the original header.

The new rebuilt header and the remaining data (directly from block 34 or from another intermediate storage depending on the hardware implementation), are provided by block 34 to Packet builder block 38 that will transmitted the rebuilt packet to OUT interface.

Figure 4A:
FIGS. 4A, 4B and 4C, show, respectively the structure of the packet without the invention in case of uncompressed header and in case of compressed header.
Figure 4B:
Figure 4B:
Figure 4C:
Figure 4C:

In reference to FIG. 4A, the original packet 40 includes two fields: data and header. The demarcation point between both fields is not necessarily in relation to the real protocol header and the payload definition but only to the maximum length of the template. For example the maximum template size may be arbitrarily set to 128 bytes due to the hardware implementation which doesn't necessarily match protocol header sizes.

In the preferred embodiment, the types of packets are identified by labels. Original packets 42 illustrated in FIG. 4B use a LABX type label. Such a label is just added to the header of the original packet sent on the network link. Packets 44 with compressed headers illustrated in FIG. 4C use a different structure with a specific label format. Both LABC and LABX labels are detailed hereunder.

The Label format includes an option field (OP) which tells if additional fields are added between the pure label value (SW value plus one compression bit) and the header (compressed or not). This compression bit is then followed by several fields whose presence is set using the above mentioned option field. It includes a first optional field which is the original header Checksum (CRC to verify the rebuilt header) in case of LABC or a sequence number (SEQ) field in case of LABX, a second control field (CTL) for end to end management used for header upgrade, label clear or template reset and finally the mandatory field being the delta bits (000000011101101111 in the example) also called compressed header data in case of LABC. For LABX, the normal header follows the last additional field whereas it is the compressed header in case of LABC. It should be noticed that, in case of error, to speed up the recovery process, a LABX empty packet with just a control field may be sent without including any data in answer to a failure discovered on the opposite traffic.

In the preferred embodiment, the SW value has a predefined length such as 16 bits by default. This size may change depending on the link speed and maximum number of different flows to support. If label switching is used, this value (and length) may change on each node (label swapping) but the label distribution takes care of this swapping. The compression bit follows this SW value field. A zero value indicates that the label is a LABX label whereas an one value indicates a LABC label. The Option field (Op) is set to 2 bits whose value indicates the presence or not of optional fields:

00 means no additional optional fields
01 means first option only: Sequence Number (Seq) if LABX or Header checksum (CRC) if LABC
10 means second option only: Control Field in both cases
11 means both options The sequence number is a 2 bytes field, the CRC is a 2 or 4 bytes field, the control field is one byte in the proposed embodiment with extension capabilities defined within the control field. The control field allows exchanging information or commands between the ingress node and the egress node such as command mode, configuration mode, label exchange mode, template exchange mode, security mode and recovery mode. The mode is defined with the three first bits. The 3 next bits define the action and the two last bits the extension of control field to exchange more date and depends on the action type.

Examples of use of the control field are to reset a template creation, to resend a lost or erroneous packet, to change configuration parameters such as template length, number of packets to analyze to create a template, label length or incremental field length in templates. Integrity checking of template/labels tables is also done using this field with a table reset capability.

Figure 5:
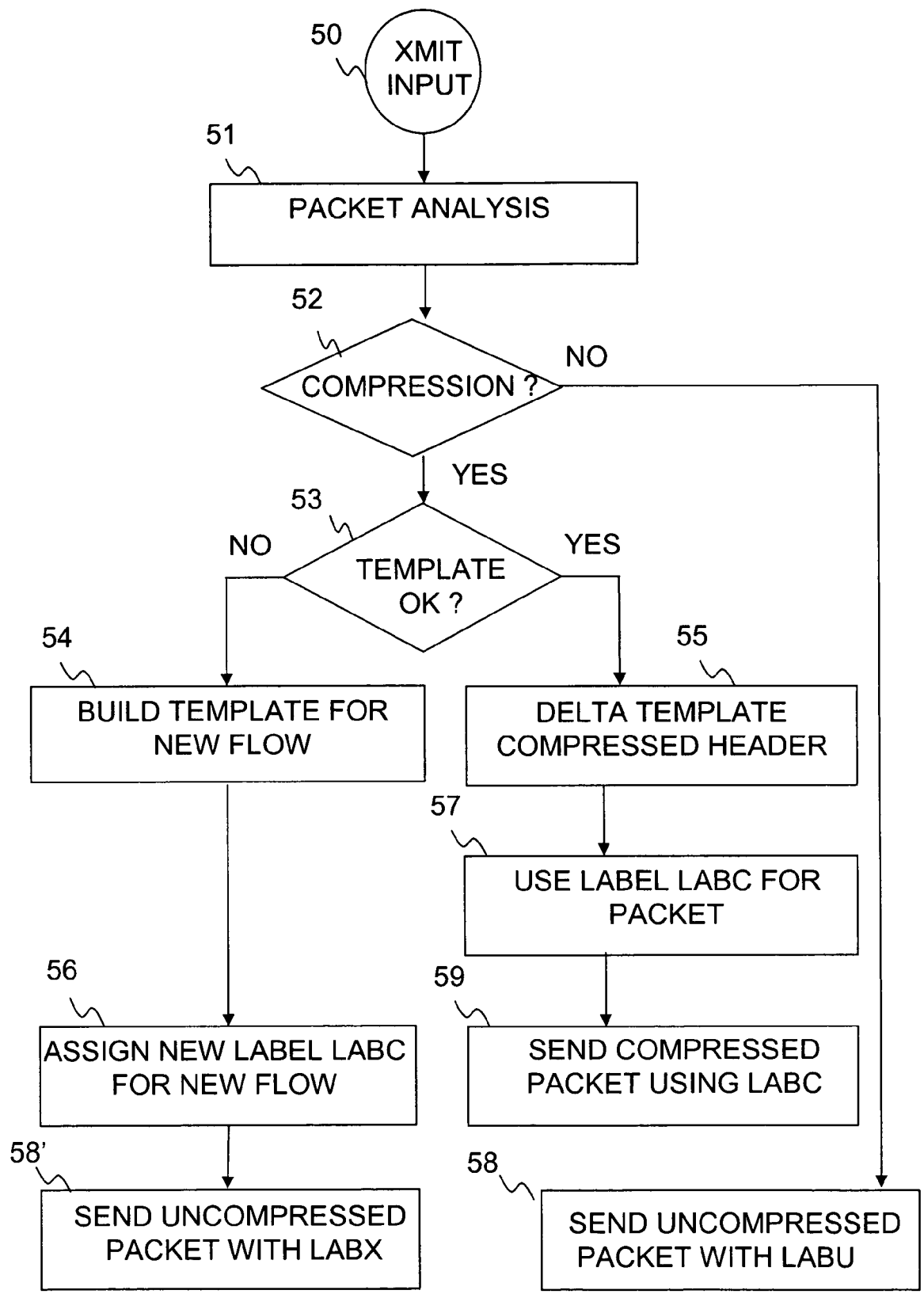
FIG. 5 is a flow chart of the method according to the invention being used in the ingress node.

The process according to the invention which is implemented in the ingress node, and illustrated in FIG. 5, starts when an original packet is received on step 50 and should be transmitted on the WAN network on which header compression is enabled. The protocol headers of the packet are analyzed on step 51 (at least the first protocol header that is IP). Based on predefined filtering, the packet either corresponds to a type for which the header compression should be applied or not. This selection on step 52 can be simply made on protocol(s) type and address fields of the header. If no header compression is required, the packet is then processed at step 58 by adding a predefined label called LABU using the LABX structure for which no additional fields are used but just the SW value followed by a zero because the process is very similar as transporting uncompressed packets but the value is defined to be not used for creating templates.

If the packet belongs to a flow for which header compression is granted, a lookup is performed to see if this packet belongs to an existing flow for which a template already exists. At step 53, if at least one template exists, the best one is chosen and the process continues on step 55 where the compressed header containing the bits different between the template and the incoming packet header are extracted and grouped to build the delta header. Then, on step 57 a label is used, provided by other means that use the structure of LABC labels. The CRC field, if used, is filed with values corresponding to the header value. The control field is added if any control data need to be transmitted on final step 59 and all fields aggregated according to the structure 44 defined in FIG. 4 followed by the transmission of the labeled packet on the WAN network.

If the lookup of step 53 ends with no template found for the packet, a new template needs to be built. A sequence number is temporarily assigned so that other packets of the same flow will get the same processing and will participate to the template creation. This function of step 54 can work in two modes. Either a full new template creation is performed or an update template is activated. The latter is only possible if step 53 has been able to find a template close to a template to use but with some minor differences preventing from using it directly. In that case, this template is provided for the template creation as a reference but not as a real template so that the created template will be more restrictive with more delta bits to send. It may be the case within a flow where the packets have a common address and protocols fields in which some other fields does not change at the beginning of the transmission but only after a significant number of packets. For such a flow, learning the first packets does not provide a valid template for all the packets of that flow.

The template is built in both cases using the consecutive packets of the same flow which are identified as having the same result after template looking resulting in the same flow number assignment. The LABC label is requested on step 56 when a packet starts a template creation. Following packets of the same flow will bypass step 56. The process, on step 58', ends by the transmission of the uncompressed original packet labeled with LABX using the format 44 defined in FIG. 4 on the WAN network. At this point, the sequence number is incremented and, if necessary, a control field added in LABX.

Figure 6:
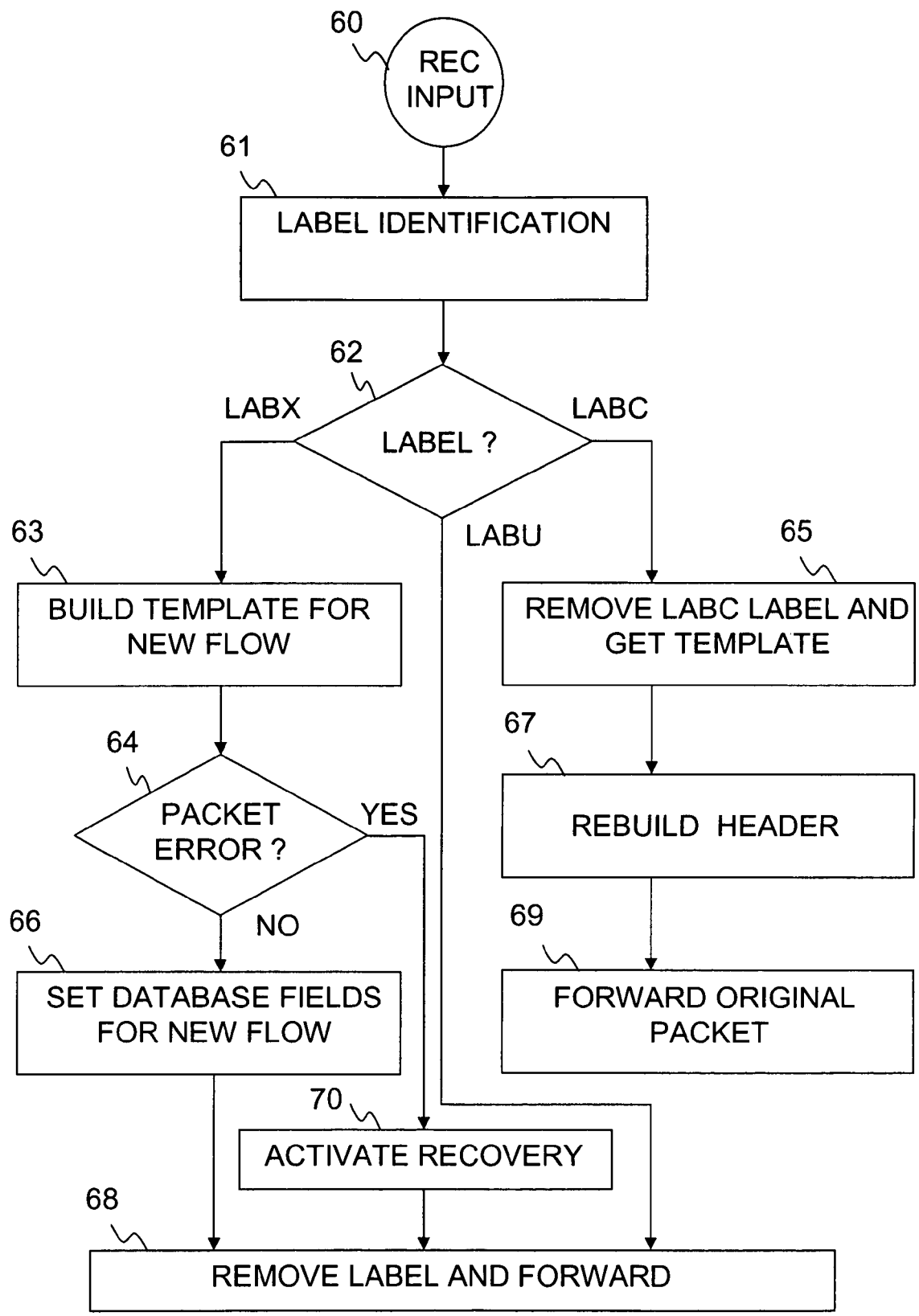
FIG. 6 is a flow chart of the method according to the invention being used in the egress node.

FIG. 6 describes the reception process in the egress node which starts when a labeled packet is received from the WAN network on step 60. The process path selection is performed on step 61 with three possible processes. If the incoming packet label is a LABX type, the process goes to step 63 corresponding to uncompressed packets received for template creation. If the incoming label is a LABU type, the process goes to step 68 corresponding to uncompressed packets that do not need template creation as being always transported transparently. If the label is a known LABC type, the process goes to step 65 corresponding to packets with compressed headers for which the header should be regenerated. Unknown LABC labels are handled by an error process not shown.

The detailed process for packets transported with LABX labels starts on step 63 where a new template is created using exactly the same process defined at step 54 in FIG. 5 as both ingress and egress nodes should follow the same process which should result in the same template. If a LABX is used for which a LABC is already assigned, the template creation uses the update mode while, if no LABC is associated corresponding to a unknown LABX, a full new creation is performed. For each packet received, the sequence number is checked as well as packet integrity (checksum checking). In case of packet error discovered on step 64, the template creation is stopped as it will result in creating a different template on both sides. Therefore, the activate recovery process of step 70 is called by step 64 in order, either to reset the template creation, or to request the failing packet to be retransmitted if possible, which is done using control fields on the transmission side of the present node corresponding to the link between blocks 35 and 28 of respectively FIG. 3 and FIG. 2. Then, the process continues on step 68. When no error is found on step 64, a new LABC and Template row corresponding to the received LABX label is stored at step 66, when the first packet is processed in a template creation in case of new unknown LABX decoded. Step 66, row creation in database is bypassed for further packets of the same flow used for the same template creation and in case of existing LABX corresponding to a template update. Finally, step 68 removes the LABX or the LABU label on a transparent packet and forwards these packets to the destination interface of the egress node. Even erroneous packets from step 62 are forwarded as if they have to be discarded, this being not a function included in the present system.

The detailed LABC process starts on step 65 where LABC label is removed and a lookup provides the corresponding template that allows rebuilding the original header on following step 67. At this step, an integrity checking can be performed if the CRC header option is enabled. Otherwise, depending on protocols, the full packet CRC, if present and unchanged since the ingress node input, may be used to validate the header reconstitution. Finally, on step 69, the rebuilt packet is transmitted to the destination interface of the egress node.

While the foregoing is directed to embodiments of the present invention, other and further embodiments of the invention may be devised without departing from the basic scope thereof, and the scope thereof is determined by the claims that follow.

The invention claimed is:

1. A header compression system for compressing a header of a plurality of data packets of a flow transmitted through a data transmission network, comprising:
   an ingress node and an egress node comprising hardware;
   flow lookup code in said ingress node adapted to determine if an existing compression template matches at least a source address or a destination address of said flow in a template and label table;
   template creating code, in both said ingress node and said egress node, adapted to create a new compression template in said template and label table from a predetermined number of uncompressed data packets at a beginning of said flow respectively transmitted by said ingress node and received by said egress node, wherein said new compression template is identical in said ingress node and said egress node, wherein said new compression template is created if said existing compression template is not found by said flow lookup code; and
   header compression code, in said ingress node, adapted to compress the header of each packet of said plurality of data packets following said predetermined number of uncompressed data packets before transmitting said plurality of data packets through said data transmission network, wherein said compressing of the header of each packet is achieved by using said new compression template.

2. The header compression system according to claim 1, wherein said egress node comprises decompression code adapted to decompress the header of each packet received after said predetermined number of data packets, wherein said decompressing of the header of each packet is achieved by using said new compression template.

3. The header compression system according to claim 2, wherein said ingress node further comprises a label management block adapted to provide a first label to be added to the header of each data packet amongst said predetermined number of uncompressed data packets and a second label to be added to the header of each compressed data packet transmitted after said predetermined number of uncompressed data packets.

4. The header compression system according to claim 3, wherein said first label and second label include a compression bit which has a predetermined value (0) in said first label and wherein said second label corresponds to said first label in which said compression bit is set to the complementary value (1).

5. The header compression system according to claim 4, wherein said template creating code comprises said template and label table containing the one or more templates which have been created, a packet analysis and lookup block for respectively comparing the header of each packet to be transmitted by said ingress node.

6. The header compression system according to claim 1, wherein said new compression template includes a mask composed of as many bytes as the header to be compressed and wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

7. The header compression system according to claim 2, wherein said new compression template includes a mask composed of as many bytes as the header to be compressed and wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

8. The header compression system according to claim 3, wherein said new compression template includes a mask composed of as many bytes as the header to be compressed and wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

9. The header compression system according to claim 4, wherein said new compression template includes a mask composed of as many bytes as the header to be compressed and wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

10. The header compression system according to claim 5, wherein said new compression template includes a mask composed of as many bytes as the header to be compressed and wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

11. A compression process for compressing a header of a plurality of data packets of a flow transmitted from an ingress node to an egress node through a data transmission network, comprising:
   determining whether there is an existing compression template that matches at least a source address or a destination address of the flow in a template table;
   creating a new compression template in said template table in both said ingress node and said egress node when said existing compression template is not found in said template table by using a predetermined number of uncompressed data packets at a beginning of said flow respectively transmitted from said ingress node and received by said egress node, wherein said compression template is identical in said ingress node and said egress node; and
   compressing the header of each packet of said plurality of data packets following said predetermined number of uncompressed data packets before transmitting said plurality of data packets through said data transmission network, wherein said compressing of the header of each packet is achieved by using said new compression template.

12. The compression process according to claim 11 wherein, in said ingress node, a label of a first type (LABX) is added to the header of each data packet amongst said predetermined number of uncompressed data packets and a label of a second type (LABC) is added to the header of each compressed data packet transmitted after said predetermined number of uncompressed data packets.

13. The compression process according to claim 12, wherein said label of a first type (LABX) includes a compression bit which has a predetermined value (0) and wherein said label of a second type (LABC) corresponds to said first label in which said compression bit has a complementary value (1).

14. The compression process according to claim 13, wherein a label of a third type (LABU) is added to the header of each data packet of a flow for which a header compression is not required.

15. The compression process according to claim 14, wherein said determining determines several existing compression templates for said flow and wherein a compression template having less undefined fields relative to other compression templates of said several existing compression templates is chosen amongst said several existing compression templates.

16. The compression process according to claim 14, wherein said creating said new compression template in said ingress node is used in an update mode when it is determined that there is no existing compression template for the flow to which said data packet belongs but there is a previous flow having same source and destination addresses, wherein a compression template corresponding to the previous flow is referenced in said update mode.

17. The compression process according to claim 16, wherein said label of a first type (LABX) to be added to the header of each uncompressed data packet amongst the predetermined number of uncompressed data packets is the label of a second type (LABC) associated with said previous flow in which said compression bit has been set to said predetermined value (0).

18. The compression process according to claim 17, wherein said creating said new compression template is achieved only if the header of the data packet being received includes a label of a first type (LABX).

19. The compression process according to claim 18, wherein a label of a second type (LABC) corresponding to said label of a first type (LABX) included in the header of said received data packet in which the compression bit has been set to said complementary value (1) is stored.

20. The compression process according to claim 19, further comprising decompressing the header of each packet received by said egress node and including said label of a second type (LABC).

21. The compression process according to claim 20, wherein the header of each data packet including said label of a second type (LABC) is decompressed in said egress node by using said new compression template created by using said predetermined number of uncompressed data packets.

22. The compression process according to claim 21, wherein the label of said first type (LABX) added to the header of each data packet belonging to said predetermined number of uncompressed data packets includes a sequence number in order to check in said egress node that no data packet has been lost.

23. The compression process according to claim 11, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

24. The compression process according to claim 12, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

25. The compression process according to claim 13, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

26. The compression process according to claim 14, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

27. The compression process according to claim 15, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

28. The compression process according to claim 16, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

29. The compression process according to claim 17, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

30. The compression process according to claim 18, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

31. The compression process according to claim 19, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

32. The compression process according to claim 20, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

33. The compression process according to claim 21, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

34. The compression process according to claim 22, wherein said new compression template includes a mask composed of as many bytes as the header to be compressed wherein changing bits of said header are reflected in said mask as bits 1 whereas constant bits of said header are reflected in said mask as bits 0, said mask resulting from a logical exclusive OR between corresponding bits of the packet headers belonging to said predetermined number of uncompressed data packets.

* * * * *